United States Patent [19]

Sugeno et al.

[11] Patent Number: 4,902,918
[45] Date of Patent: Feb. 20, 1990

[54] PROGRAMMABLE LOGIC ARRAYS WITH EACH ARRAY COLUMN DIVIDED INTO A PLURALITY OF SERIES CONNECTIONS OF FETS

[75] Inventors: Yukio Sugeno, Yokohama; Kimiyoshi Usami; Tohru Sasaki, both of Kawasaki; Yasuyuki Nozuyama, Meguro, all of Japan

[73] Assignee: Kabushiki Kaisha Toshiba, Kawasaki, Japan

[21] Appl. No.: 205,940

[22] Filed: Jun. 13, 1988

[30] Foreign Application Priority Data

Sep. 25, 1987 [JP] Japan ............................... 62-239154

[51] Int. Cl.⁴ .......................................... H03K 17/04
[52] U.S. Cl. .................................. 307/468; 307/443; 307/469
[58] Field of Search ............... 307/443, 448, 451, 465, 307/468–469, 303; 364/491, 716

[56] References Cited

U.S. PATENT DOCUMENTS

| | | | |
|---|---|---|---|
| 3,953,743 | 4/1976 | Hollingsworth | 307/448 |
| 4,415,819 | 11/1983 | Mathes | 307/453 X |
| 4,430,583 | 2/1984 | Shoji | 307/448 |
| 4,644,192 | 2/1987 | Fisher | 307/465 |
| 4,659,948 | 4/1987 | Sunter et al. | 307/452 X |
| 4,758,746 | 7/1988 | Birkner et al. | 307/468 X |

OTHER PUBLICATIONS

Cases et al, "Improving the Performance of a Transfer Gate PLA Structure", IBM T.D.B., vol. 25, No. 4, Sep. 1982, pp. 2215–2216.

Primary Examiner—David Hudspeth
Attorney, Agent, or Firm—Foley & Lardner, Schwartz, Jeffery, Schwaab, Mack, Blumenthal & Evans

[57] ABSTRACT

Programmable logic arrays (PLAs) in the form of a matrix having each array column consisting of a plurality of FETs (Field Effect Transistors) in which cell arrays constituting each array column for producing logical product output signals are divided into a plurality of array blocks so as to reduce the number of the FETs to be connected in series in each array block and to eventually reduce the series resistance of each of the array columns, and the output signals from each of the array blocks thus divided are applied to the input terminals of each logical circuit so as to reduce each combined logical product from each logical gate, thereby realizing high speed operation for the PLAs.

3 Claims, 5 Drawing Sheets

PROGRAMMABLE LOGIC ARRAYS WITH EACH ARRAY COLUMN DIVIDED INTO A PLURALITY OF SERIES CONNECTIONS OF FETS

BACKGROUND OF THE INVENTION

1. Field of the Invention

The present invention relates to programmable logic arrays for performing high speed operations.

2. Description of the Prior Art

Programmable logic arrays (PLA) incorporated in different logical LSIs, such as microprocessors, and used for control circuits and decoders are mainly divided into two categories: NOR type PLAs having an array area constructed by transistors arranged at each intersection of orthogonal wiring leads and NAND type PLAs having an array area constructed by transistors connected in series, respectively.

FIG. 1 indicates the construction of a conventional NAND type PLA having three sets of cell arrays consisting of N-channel FETs (which are referred to hereinafter as NFETs) connected in series and conductively controlled by input signals IN1 through IN6 or their inverted signals so as to produce logical product output signals OUT1 through OUT3 corresponding to each of the arrays.

Among the three sets of arrays, the cell array block 1 comprises NFETs 3, . . . 3 connected in series with each other and the number of these NFETs is the same as that for the input terminals, which are conductively controlled by the input signals IN1 through IN6 applied to the input terminals or their inverted signals. One terminal of the NFETs is connected to a ground and the other terminal of the NFETs is connected to a power supply $V_{cc}$ on one side through a P-channel FET5 (which is referred to hereinafter as PFETs) which is always rendered conductive, and to the input terminal of an inverter 7 on the other side.

The output of the cell array block 1 is inverted by the inverter 7 and the following logical product output signal OUT3 is produced from the inverter 7:

$$OUT3 = IN1 \cdot IN2 \cdot IN3 \cdot IN4 \cdot IN5 \cdot IN6$$

In the manner described, the NAND type PLA is constructed by a plurality of FETs connected in series so as to produce each of the inverted output signals as logical product outputs.

In this circuit, when all of the FETs (Field Effect Transistors) in series are rendered conductive, a current path is formed. However, the total ON-type resistance of the FETs becomes large because of the series connected FETs and steady current is restricted to low levels. As a result, there is the advantage that the circuit can be operated at low power consumption.

On the other hand, for the NAND type PLA, when formed in an integrated-circuit, its layout can be realized within a smaller area compared with the NOR type PLA, thus enabling its construction to be miniturized. But with the NAND type PLA, unfortunately, since it is constructed with the number of FETs being the same as that of the input terminals, the ON-time resistance of each of the FETs becomes larger as the input terminals are increased. As a result, its access time or time delay increases.

SUMMARY OF THE INVENTION

It is an object of the present invention to overcome the above drawbacks and to provide high speed programmable logic arrays without losing the advantages of low power consumption and innate miniturization of size.

One feature of the present invention resides in a programmable logic array in the form of a matrix having array columns comprising a plurality of first type FETs as cell arrays connected in series, wherein the cell arrays of each array column are divided into a plurality of cell array blocks, and each second type FET is connected between a power supply and each of the specific FETs in each array column and each logic gate is provided at each array column, and the input terminals of each logic gate are connected to the output of each of the cell blocks thus divided, with each of the junctions between the cell array blocks connected to the ground so as to reduce the resistance of the cell arrays in each array column.

Another feature of the present invention resides in a programmable logic array wherein the plurality of cell array blocks thus divided are two blocks and each of the control gates of the second type and of the first type FETs facing each other at the junction between the array blocks are connected to precharge lines so as to supply each of the precharge signals thereto respectively and to permit each array column consisting of the FETs to be properly precharged.

In the present invention, since the cell arrays are divided into a plurality of groups and the number of stages of the FETs connected in series in the cell arrays is decreased, each logical product can be obtained from the cell arrays thus divided, thereby allowing high speed operation to be realized while still maintaining low power consumption and without adversely affecting the innate miniturized size.

These and other objects, features and advantages of the present invention will be apparent from the following detailed description of the embodiments in reference to the accompanying drawings.

DETAILED DESCRIPTION OF THE PREFERRED EMBODIMENTS

Figure 1:
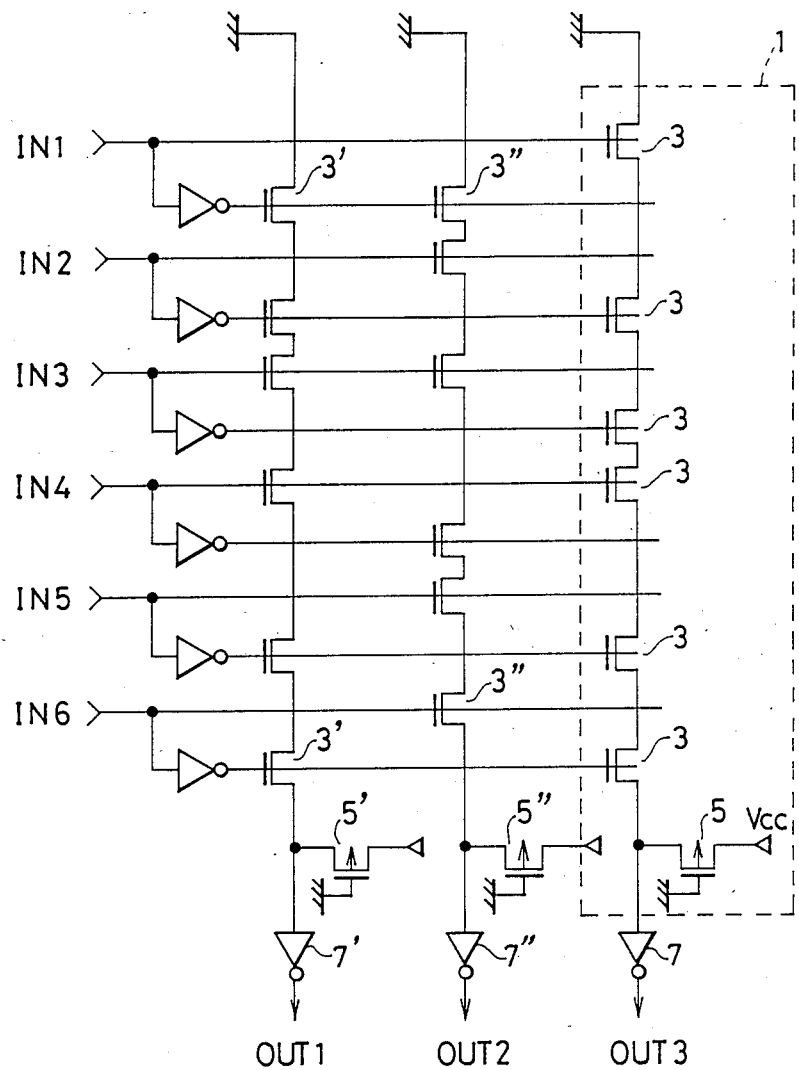
FIG. 1 indicates a programmable logic array of the NAND type according to the prior art, FIG. 2 indicates one embodiment of the NAND type programmable logic array according to the present invention, FIG. 3 indicates a variation of the programmable logic array of the NAND type of FIG. 2 according to the present invention, FIG. 4 indicates a second embodiment of the NAND type programmable logic array according to the present invention, in which cell arrays are divided into three array blocks, and FIG. 5 indicates a third embodiment of the programmable logic array according to the present invention, in which precharge signal lines are provided.
Figure 2:
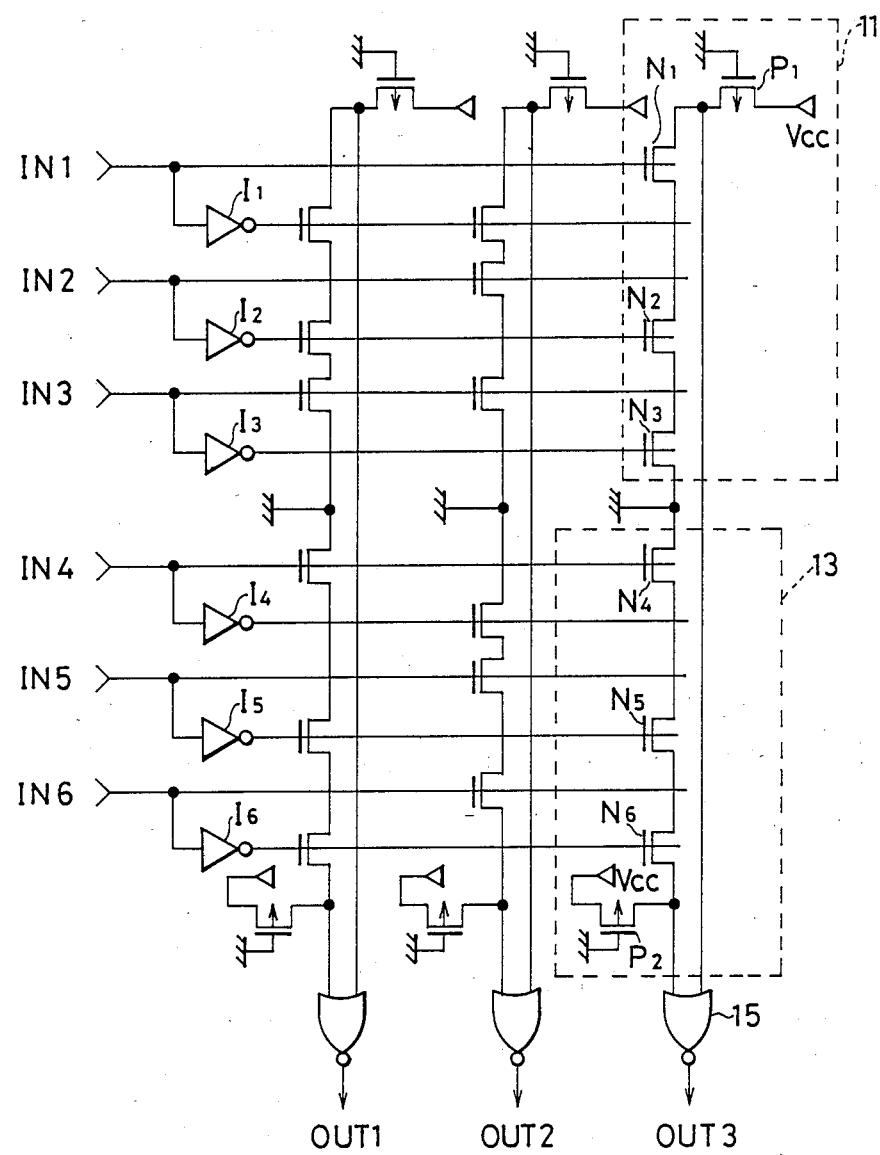

FIG. 2 shows one embodiment of the NAND type programmable logic array (PLA) according to the present invention, similar to that of FIG. 1. In the figure, each of the cell arrays, having NFETs connected respectively in series are divided into two groups. For instance, in the cell arrays of the third column for producing an output signal OUT3, the cell arrays having NFETs N1, N2, N3, . . . , N6 are divided into two groups of array blocks 11 and 13. The cell array block 11 comprises the three NFETs N1, N2 and N3 connected in series, with the free end of the NFET N3 connected to a ground and the free end of the NFET N1 connected to a power supply $V_{cc}$ through a PFET P1 as a load transistor.

The cell array block 13 similarly comprises three NFETs N4, N5 and N6 connected in series, with the free end of the NFET N4 connected to the ground and the free end of the NFET N6 connected to the power supply $V_{cc}$ through a PFET P2 on one hand and to one input of a NOR gate 15. The other input terminal of the NOR gate 15 is connected to the free end of the NFET N1.

The NFET N1 is conductively controlled by an input signal IN1, the NFET N2 is controlled by an output signal from an inverter I2, and the NFET N3 is controlled by the inverted signal of an input signal IN3 from an inverter I3.

The logic of the one input terminal of the NOR gate 15 is determined by the input signal IN1 and by the inverted signals of the input signals IN2 and IN3, that is:

one logical half=IN1 . IN2 . IN3

Similarly, the NFET N4 is conductively controlled by an input signal IN4 and the NFET N5 is controlled by the inverted signal of an input signal IN5 from an inverter I5, while the NFET N6 is controlled by the inverted signal of an input signal I6 from an inverter I6. The logic of the other input terminal of the NOR gate 15 is determined by the input signal IN4 and by the inverted signals of the input signals IN5 and IN6 from the inverters I5 and I6, that is:

the other logical half=IN4 . IN5 . IN6

Accordingly, the combined logical product output signal OUT3 from the NOR gate 15 becomes as follows:

OUT3=IN1 . IN2 . IN3 . IN4 . IN5 . IN6

As is appreciated from the circuit of FIG. 2, the output signal OUT3 produced from the NOR gate 15 through the cell array blocks 11 and 13 becomes equivalent to the output signal OUT3 produced by the inverter 7 in FIG. 1.

In the same manner, the output signals OUT1 and OUT 2 produced from the first and second columns are equivalent to the output signals OUT1 and OUT2 in FIG. 1, respectively.

As described in the foregoing embodiment according to the present invention, each transistor column has six NFETs; e.g., the NFETs N1 through N6 are divided into two groups respectively, with the center junction between NFETs N3 and N4 connected to the ground while the other ends of NFETs N1 and N6 are connected to the input terminals of the NOR gate 15, so that the ON-time resistance of each transistor column is only one half of the value that one would have for the configuration shown in FIG. 1. As a result, the time delay until each of the output signals OUT1 through OUT3 is produced is strikingly reduced.

Moreover, although the total power consumption might be increased by the division of the cell arrays into two respective groups, the increment would be very small and so any problems that may arise in the PLA according to the present invention as a whole are essentially negligible.

Furthermore, when assembling the PLA according to the present invention into an integrated circuit, although the size might be slightly increased due to the increase in the wiring leads and additional PFETs, this increment can be neglected in view of IC techniques or also by, for instance, multi-layer wiring techniques.

Figure 3:
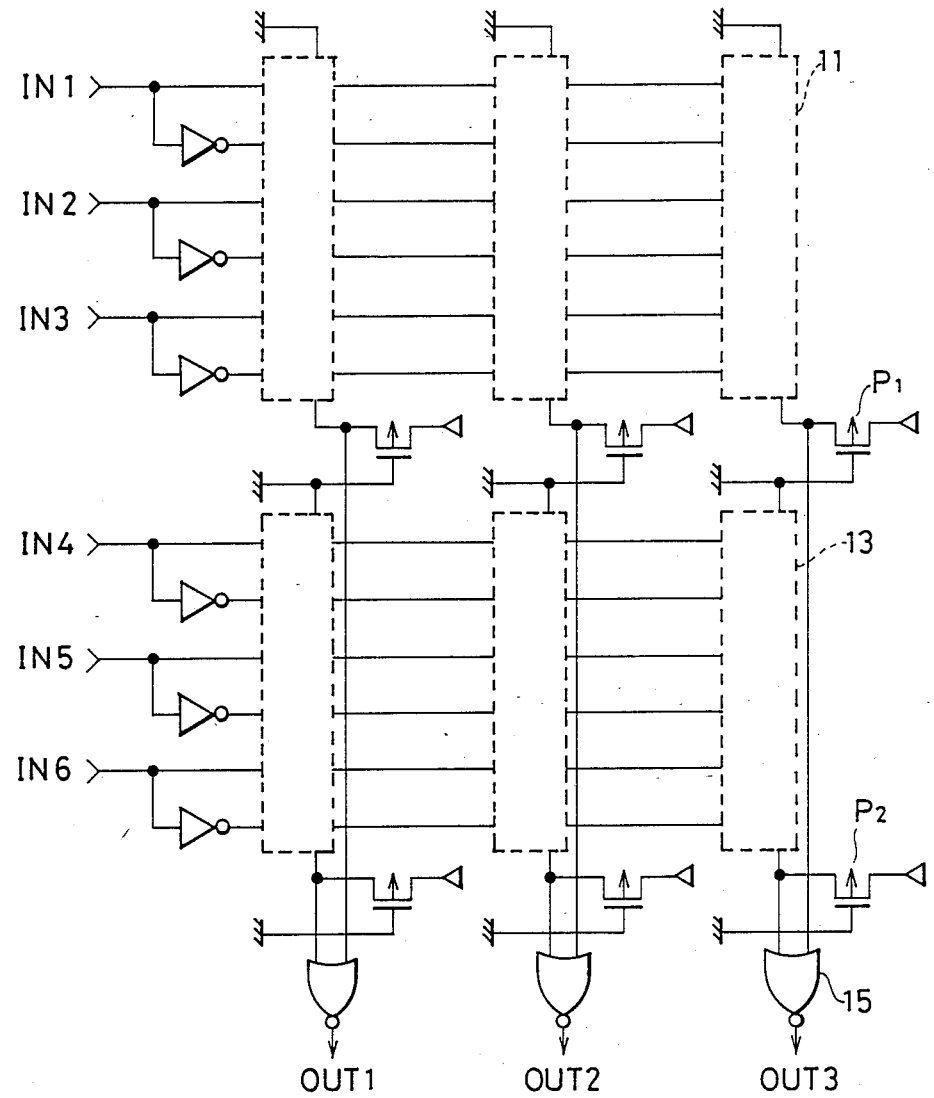

FIG. 3 shows one example of reducing the wiring lengths. As shown in the figure, the PLA is arranged such that the output terminal of the PFET P1 in the cell array block 11 is disposed closer to the NOR gate 15 so as to shorten the wiring length thereof, which in turn permits the operation time of the logical circuit to be shortened.

Figure 4:
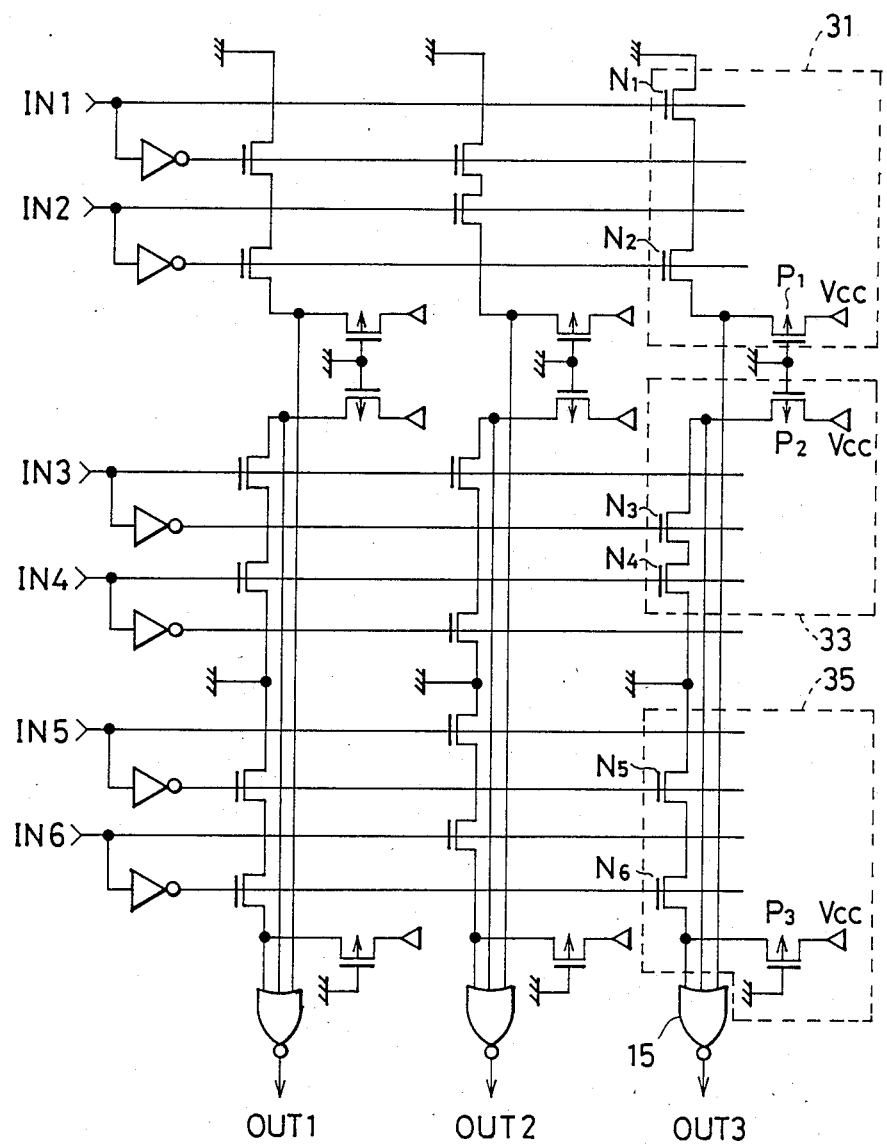

FIG. 4 shows a second embodiment of the PLA according to the present invention. In this embodiment, each cell array column consisting of the six NFETs is divided into three groups. For instance, the cell arrays in the third column for producing an output signal OUT3 are divided into three array blocks 31, 33, and 35. The cell array block 31 comprises NFETs N1 and N2 and PFET P1 connected in series, with one terminal of the NFET N1 connected to the ground and with one terminal of the NFET N2 connected to one input of an NOR gate 15 as well as to a power supply $V_{cc}$ through the PFET P1.

Similarly, the array block 33 comprises NFETs N1 and N2 and PFET P2 connected in series, with one terminal of the NFET N3 connected to the power supply $V_{cc}$ through a PFET P2 as well as to the second input terminal of the NOR gate 15 and with one terminal of the NFET N4 connected to the ground. The array block 35 comprises NFETs N5 and N6 and a PFET P3 connected in series, with one terminal of the NFET N5 connected to the ground and with one terminal of the NFET N6 connected to the power supply $V_{cc}$ through a PFET P3 and to the remaining terminal of the NOR gate 15.

With this construction, the ON-time resistance of each transistor column can be reduced to about one third of the value that one would have for the configuration shown in FIG. 1, thereby realizing high speed operation of the PLA circuit according to the present invention.

Figure 5:
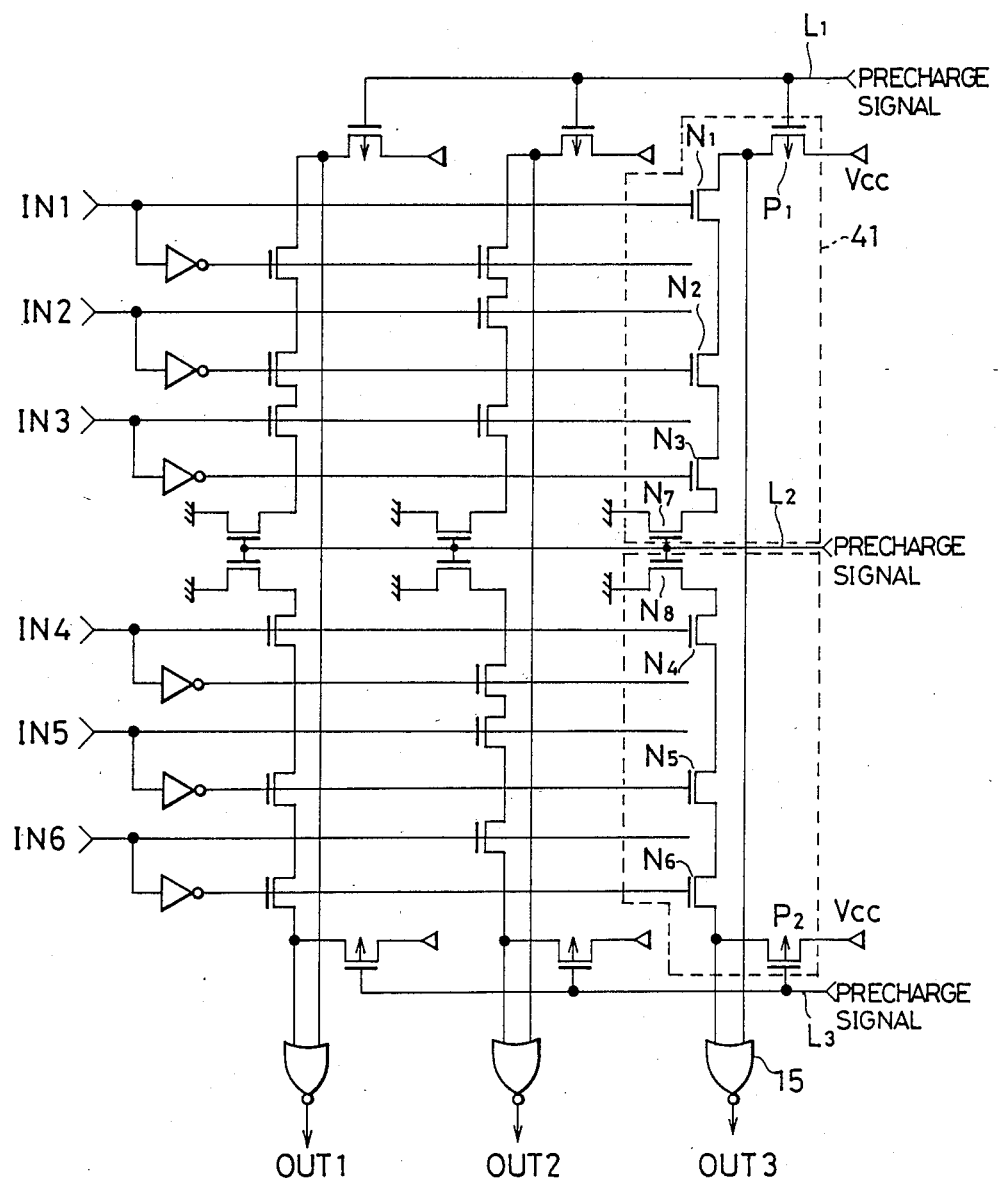

FIG. 5 shows a third embodiment of the PLA of a synchronization type according to the present invention, which is realized by slightly modifying the first embodiment shown in FIG. 2. In this embodiment, additional NFETs N7 and N8 are connected between one terminal of the NFET N3 and the ground and between one terminal of the NFET N4 and the ground, respectively, and each control electrode of the PFETs P1 and P2 as well as each control electrode of the NFETs N7 and N8 are connected to each of the precharge lines L1 through L3.

With this construction, the cell arrays constituting each of the cell array columns are properly precharged in accordance with each precharge signal applied to the control electrodes of the FET transistors.

In the embodiment shown in FIG. 5, the output signals from each array column are provided as a non-ratio type PLA, and the power consumption can be reduced to a value below that for the configuration shown in FIG. 2, thereby realizing high speed operation of the PLA.

The number of the divided cell array blocks is determined in accordance with the number of the NFETs, however, as a general, the more the number of the array blocks is increased, the more the speed of the operation is increased.

As was described in the PLA of the foregoing embodiments according to the present invention, cell arrays constituting each of the array columns for producing logical product output signals are divided into a plurality of cell array blocks so as to reduce the number of FETs to be connected in series in each cell array block, and the output signals from each of the cell arrays thus divided are applied to the input terminals of each logical gate so as to produce each combined logical product from each logical gate.

Consequently, the ON-time resistance of each FET connected in series in each cell array column can be strikingly reduced, thereby realizing high speed operation of the PLAs without lowering the power consumption and without increasing the size thereof.

While the invention has been described in its preferred embodiments, it is to be understood that the words which have been used are words of description rather than limitation and that various changes and modification may be made within the purview of the appended claims without departing from the true scope and spirit of the invention in its broader aspects.

What is claimed is:

1. A programmable logic array comprising:
   a set of input terminals;
   a plurality of first FETs arranged in columns in matrix form, said first FETs in each column of said columns being programmably coupled with said input terminals at their gate terminals, each of said columns being divided into a plurality of series connections of said first FETs, each of said series connections being connected to a higher logic level through a second FET at one end and to a lower logic level at the other end; and
   a plurality of OR gates having their input terminals connected, respectively, to said one end of each of said series connections in order to produce, as an output of said logic array, the logical sum of the logical levels at said one end of each of said series connections belonging to each of said columns.

2. The array of claim 1 wherein said input terminals are prepared to provide complementary pairs of logical input signals.

3. The array of claim 1 wherein said other end of each of said series connections is connected to said lower logic level through a third FET receiving a precharge signal at its gate terminal in order to be turned off by said precharge signal, and wherein the gate terminals of said second FETs are coupled to receive said precharge signal in order to be turned on by said precharge terminals.

* * * * *